US006445755B1

(12) United States Patent
Chung et al.

(10) Patent No.: US 6,445,755 B1
(45) Date of Patent: Sep. 3, 2002

(54) TWO-STEP SOFT OUTPUT VITERBI ALGORITHM DECODER USING MODIFIED TRACE BACK

(75) Inventors: Won-hee Chung, Suwon (KR); Jun-jin Kong, Seongnam (KR); Taek-won Kwon, Taegukwangyeok (KR); Dae-won Kim, Taegukwangyeok (KR); Jun-rim Choi, Taegukwangyeok (KR)

(73) Assignee: Samsung Electronics Co, Ltd., Kyungki-Do (KR)

( * ) Notice: Subject to any disclaimer, the term of this patent is extended or adjusted under 35 U.S.C. 154(b) by 89 days.

(21) Appl. No.: 09/661,555

(22) Filed: Sep. 14, 2000

(30) Foreign Application Priority Data

Sep. 14, 1999 (KR) ........................................... 99-39334

(51) Int. Cl.$^{7}$ ............................ H03D 1/00; H04L 27/06

(52) U.S. Cl. ....................... 375/341; 375/262; 714/795; 714/796

(58) Field of Search ................................ 375/341, 262; 714/794, 795, 796

(56) References Cited

U.S. PATENT DOCUMENTS

| | | | | |
|---|---|---|---|---|
| 5,295,142 A | * | 3/1994 | Hatakeyama | 714/795 |
| 5,881,075 A | * | 3/1999 | Kong et al. | 714/795 |
| 6,301,314 B1 | * | 10/2001 | Murayama | 375/341 |
| 6,301,684 B1 | * | 10/2001 | Watanabe et al. | 714/796 |
| 6,317,472 B1 | * | 11/2001 | Choi et al. | 375/341 |

FOREIGN PATENT DOCUMENTS

| | | | |
|---|---|---|---|
| JP | 7-254861 | 10/1995 | H03M/13/12 |
| JP | 11-163742 | 6/1999 | H03M/13/12 |

* cited by examiner

*Primary Examiner*—Temesghen Ghebretinsae
(74) *Attorney, Agent, or Firm*—Sughrue Mion, PLLC

(57) ABSTRACT

A two-step Viterbi algorithm decoder for tracing the survivor path and the concurrent path and updating a soft decision value, including a soft output Viterbi algorithm state metric unit (SOVA-SMU), which is constructed of registers and multiplexers, instead of a memory for storing survivor information for all states.

10 Claims, 8 Drawing Sheets

L'
L
TRELLIS T
INPUT SYMBOLS
$m_L(k),W_L(k)$
DELAY LINE (L)
L'
TRELLIS T'
$m_L(k)$
SURVIVOR PATH'
CONCURRENT PATH

BM_000
SM_00
BM_001
SM_01
501
FIRST ADDER
502
SECOND ADDER
A
B
503
COMPARATOR A<B
S
504
A
B
505
SUBSTRACTOR
506
SELECTOR BITS
STATE METRIC
DELTA VALUES

| s | x | y | z | p |
|---|---|---|---|---|
| 0 | t | b | c | d |
| 1 | a | t | c | d |
| 2 | a | b | t | d |
| 3 | a | b | c | t |

SOFT OUTPUT
OUTPUT
HEAD OUTPUT
RESET
DELTA
CLOCK
SELECTOR BIT
RESET
SURVIVOR STATE
COUNT
902
900
901

TWO-STEP SOFT OUTPUT VITERBI ALGORITHM DECODER USING MODIFIED TRACE BACK

BACKGROUND OF THE INVENTION

1. Field of the Invention

The present invention relates to a two-step soft output Viterbi algorithm decoder. The present application is based on Korean Application No. 99-39334 which is incorporated herein by reference.

2. Description of the Related Art

Turbo-Codes, a type of error correction code used for the correction of errors that occur in channels of digital communication systems, were introduced for the first time in 1993 by Claude Berrou, Alain Glavieux and Punva Thitimajshima, in an article entitled "Near Shannon Limit Error-Correcting Coding and Decoding: Turbo-Codes (1)", ICC'93, Geneva, Switzerland, pp. 1064–1070. Also, Turbo-Codes have been adopted as wireless transmission specifications for International Mobile Telecommunication by the year 2000 (IMT-2000), and the number of potential applications is continuing to expand.

As for parallel concatenated convolutional codes (PCCCs) of the Turbo-Codes, an information bit stream is encoded by two component encoders connected in parallel at both ends of an interleaver, and is decoded by two component decoders which are serially connected with n interleaver therebetween.

A two-step soft output Viterbi algorithm (SOVA) is applicable for turbo decoding. Application of the SOVA to a turbo decoder was described in articles entitled "Decoding Turbo-Codes with the Soft Output Viterbi Algorithm" (Joachim Hagenauer and Lutz Papke, IEEE International Symposium on Information Theory, pp. 164, Trondheim, Norway, Jun. 27 through July 1994) and "An IC for Turbo-Codes Encoding and Decoding" (C. Berrou, P. Combelles, P. Penard and B. Talibart, IEEE International Solid-State Circuits Conference, pp. 90–91, San Francisco, Calif., USA, Feb. 15 through 17, 1995).

The two-step SOVA is implemented by applying a trace back operation in two steps. A general Viterbi algorithm applies a single trace back algorithm to decide the state of a start node so as to update a soft decision value. The two-step SOVA finds a survivor path and a concurrent path by applying a double trace back algorithm from the state decided by the Viterbi algorithm. Next, if the hard decision values from the paths are different, the soft decision value for the survivor path at the state is updated.

FIG. 1 is a diagram illustrating a conventional two-step SOVA. In FIG. 1, the decoding depth of the system is equal to L+L', and the update depth for soft decision values is L'. Survivor information and soft decision values used to find the survivor path at all states, corresponding to a depth of L+L', are stored in a memory. A trace back is carried out for the depth L' from the survivor state at a time k for hard decision and soft decision using the survivor information to find the most reliable survivor state. The longer the depth for trace back is, the higher the reliability of the survivor state is. Accordingly, the soft decision value can be updated with a more reliable soft decision value.

As shown in FIG. 1, a Viterbi algorithm is carried out with a trellis T. In other words, the survivor state $m_L(k)$ and the soft decision value at time k are found by trace back. A delay line having a depth of L delays input symbols by the depth L to make the input symbols available for a trellis T'. In the trellis T', a double trace back is carried out from the survivor state $m_L(k)$. The branch and state metrics are calculated from the input symbols. The state metric can be also referred to as "path metric".

The important characteristic of the Viterbi algorithm is that if every state from a current time unit k is traced backwards through its maximum likelihood path, all of the paths converge at a state $m_L(k)$.

The double trace back is carried out to obtain the survivor path and the concurrent path from the survivor state determined by the Viterbi algorithm. Two hard decision values are yielded by the two paths and compared. If the compared hard decision values are different, the soft decision value of the survivor path is compared with he soft decision value of the survivor state given by the first track back and replaced by a smaller soft decision value.

However, the hard and soft decision described above are started by reading the survivor information from the memory. To get a reliable survivor state using the trace back algorithm, the survivor information stored in the memory, which is engaged in the depth L, must be read. Finding the survivor path and the concurrent path in the double trace back algorithm also begins with reading the survivor information from the memory. Also, when updating a soft decision value, the soft decision values for the states engaged in the depth L' are stored in the memory, and a soft decision value of the state which needs updating is read, updated and stored back in the memory. Such successive processes are started by reading information from the memory, which retards the processing speed, and increases complexity in proportion to the number of memories.

SUMMARY OF THE INVENTION

To solve the above problems, it is an objective of the present invention to provide a two-step Viterbi algorithm decoder for tracing the survivor path and the concurrent path and updating a soft decision value, including a soft output Viterbi algorithm-state metric unit (SOVA-SMU), which is constructed of registers and multiplexers, instead of a memory for storing survivor information for all states.

The above objective of the present invention is achieved by a two-step soft output Viterbi algorithm decoder, comprising: a branch metric unit for calculating branch metrics for received data from the degree of similarity between data symbols, which appear to be received if a transmission channel has no error, and the actually received data symbols; a state metric memory for storing state metrics for all states of the received data symbols; an add-compare-select unit for adding the branch metrics of the branches for each state of the current time unit and the state metrics for each state of the previous time unit stored in the state metric memory, storing the results of the additions, which satisfies a predetermined condition, as the state metrics of the current time unit in the state metric memory, and outputting a difference between the results of the additions as a delta value, and as many selector bits as the number of bits of the received data symbols so as to select a path; a survivor state output unit for outputting a survivor state satisfying a predetermined condition among the current state metrics for all states output from the add-compare-select unit; and a soft output Viterbi algorithm-state metric unit (SOVA-SMU) for back tracing a first survivor path for a first time unit from the survivor state output from the survivor state output unit, using the delta values for all states and the selector bits, to obtain the survivor state at the end of the first survivor path and a soft decision value of the first survivor path, for performing a double trace back for a second time unit from the survivor state at the end of the first survivor path to find a second survivor path and a concurrent path, for updating the soft decision value of the second survivor path by the soft decision value of the first survivor path if the hard decision values of the second survivor path and the concurrent path for the second period are different and if a soft decision value of the second survivor path is larger than the soft decision value of the first survivor path, and for outputting the hard and soft decision values of the second survivor path at the end of the second time unit.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 1:
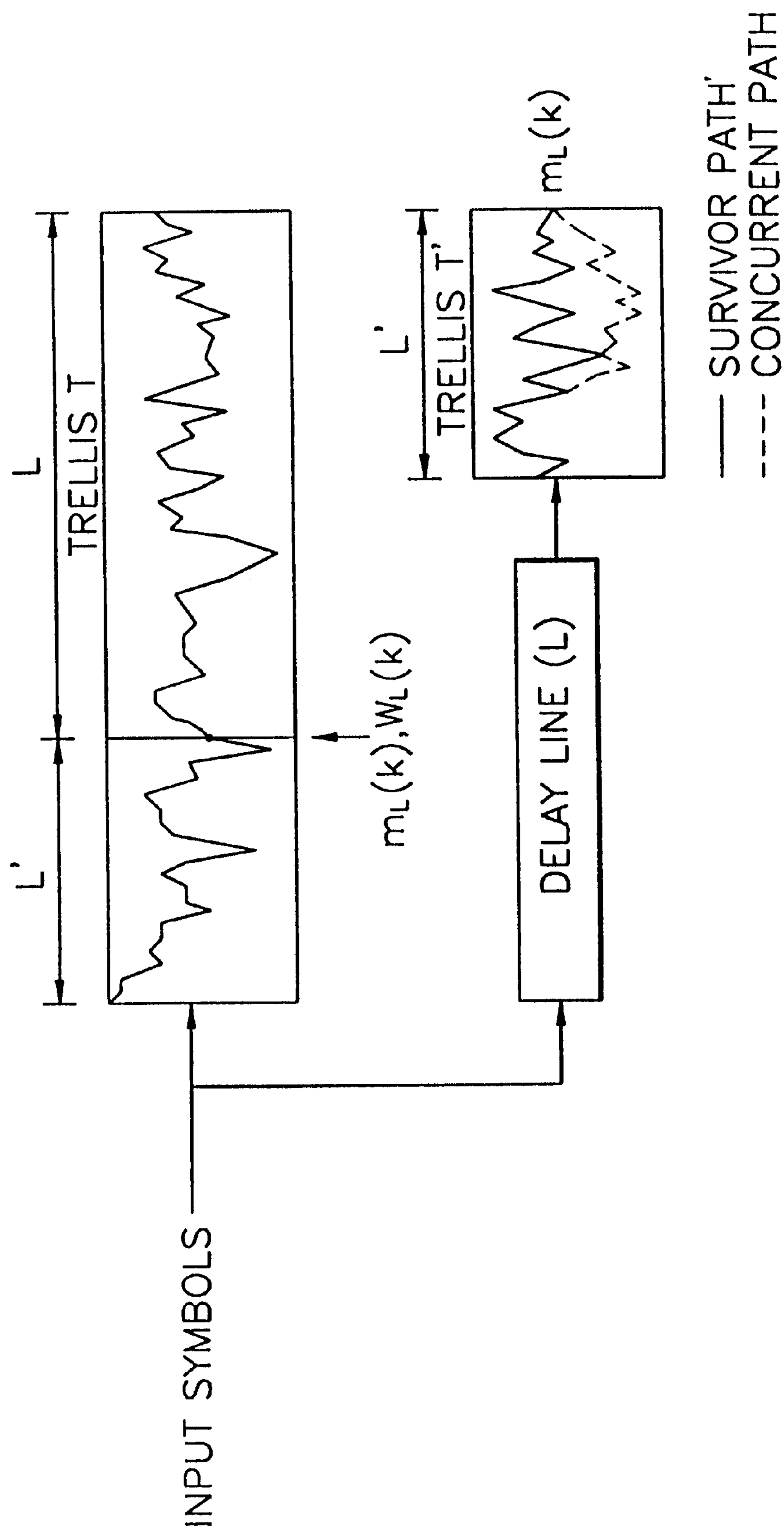
FIG. 1 is a diagram illustrating a conventional two-step soft output Viterbi algorithm (SOVA)
Figure 2:
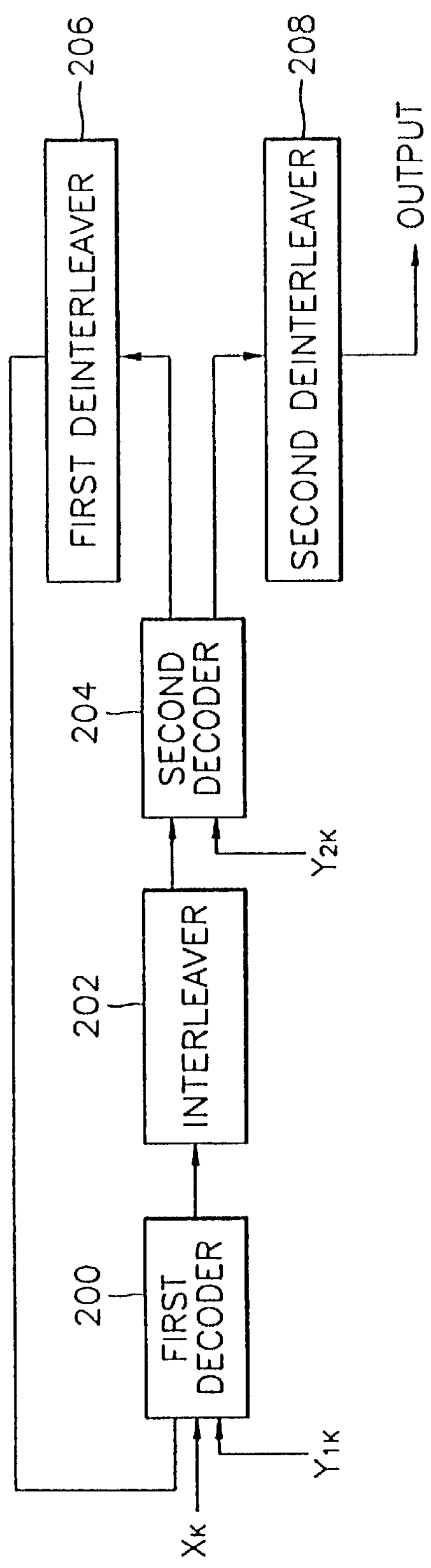
FIG. 2 is a block diagram of a turbo decoder.

A block diagram of a turbo decoder is shown in FIG. 2. Referring to FIG. 2, the turbo decoder includes a first decoder 200, an interleaver 202, a second decoder 204 and first and second deinterleavers 206 and 208.

The first decoder 200 receives an input sequence $X_k$ from an encoder (not shown) at a transmission site, an encoded sequence $Y_{1K}$ of the input sequence $X_k$ and a feedback sequence from the first deinterleaver 206, and decodes the received sequences. The interleaver 202 interleaves the signal from the first decoder 200 so as to prevent a bust error. The second decoder 204 receives the output sequence from the interleaver 202 and a sequence $Y_{2k}$ into which the input sequence $X_k$ is interleaved and encoded, and decodes the received sequences. The first deinterleaver 206 deinterleaves a soft decision value of the outputs of the second decoder 204, and feeds back the sequence to the first decoder 200. The second deinterleaver 208 deinterleaves a hard decision value of the outputs of the second decoder 204 and outputs a final decoded value.

Figure 3:
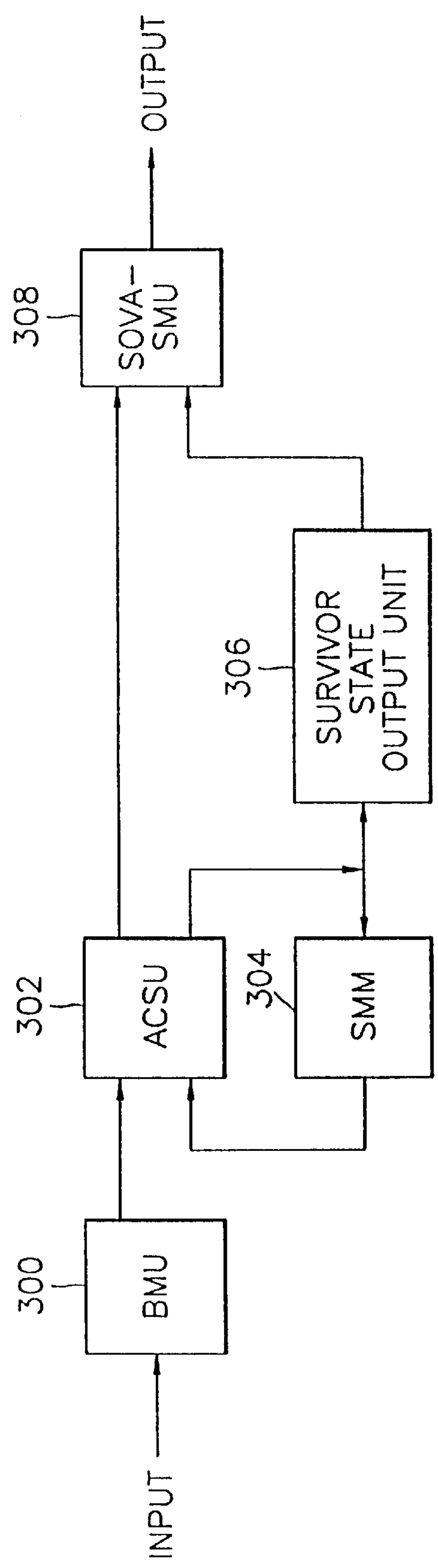
FIG. 3 is a block diagram of the first or second decoder of FIG. 2.

FIG. 3 is a block diagram of the first decoder 200 or the second decoder 204 of FIG. 2. The decoder shown in FIG. 3 includes a branch metric unit (BMU) 300, an add-compare-select unit (ACSU) 302, a state metric memory (SMM) 304, a survivor state output unit 306, and a soft output Viterbi algorithm-state metric unit (SOVA-SMU) 308.

Prior to illustration of the operation of the decoder of FIG. 3, a turbo encoder employed in the present embodiment and a trellis used for the coding will be described. Although the present embodiment is described with reference to a case having a code rate (R) of ½ and a constraint length (K) of 3, it is appreciated that if the K and R values are varied, components can vary depending on the K and R values.

Figure 4A:
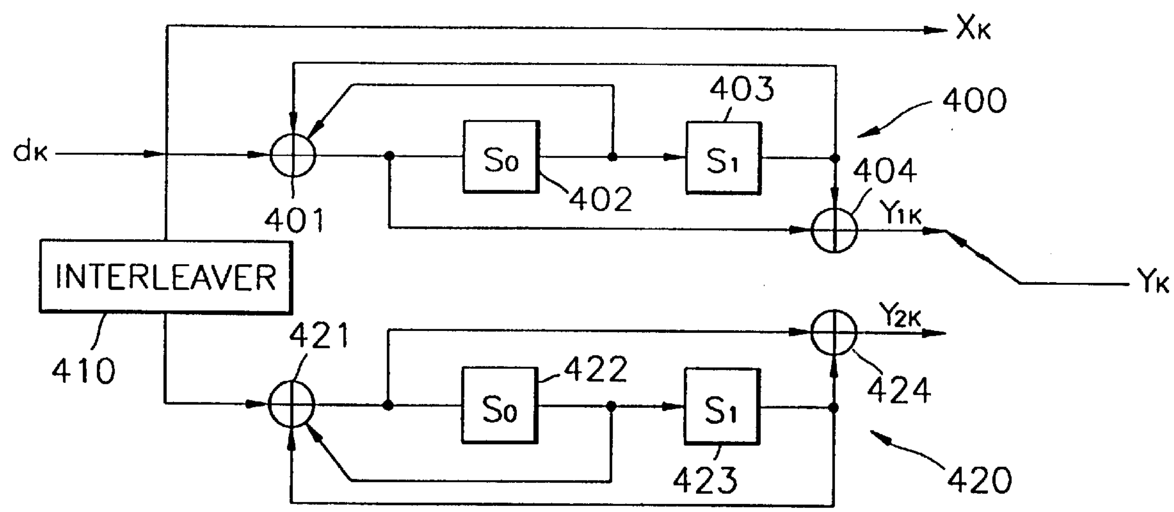
FIG. 4A is a block diagram of a turbo encoder with a constraint length of 3.
Figure 4B:
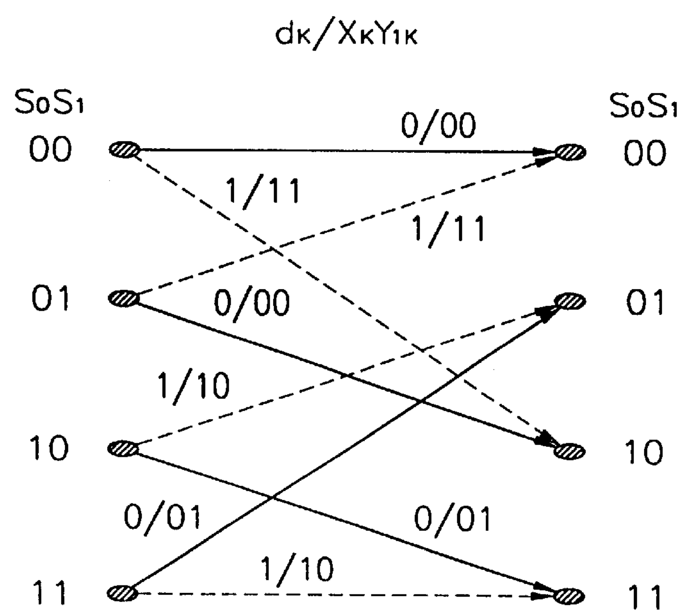
FIG. 4B is a trellis diagram illustrating the operation of the encoder of FIG. 4A.

FIG. 4A is a block diagram of a turbo encoder having a K value of 3, and FIG. 4B is a trellis diagram illustrating the operation of the encoder of FIG. 4A. Referring to FIG. 4A, the turbo encoder includes a first encoder 400, an interleaver 410 and a second encoder 420.

The first encoder 400 includes an exclusive OR operator 401, first and second state memories 402 and 403, and a second exclusive OR operator 404. The first exclusive OR operator 401 performs an exclusive-OR-operation on a received sequence $d_k$ and the outputs from the first and second state memories 402 and 403. The second exclusive OR operator 404 performs an exclusive-OR-operation on the outputs from the second state memory 403 and the first exclusive OR operator 401, and outputs the resultant value as an output value of the first encoder 400. The interleaver 410 interleaves the received sequence $d_k$. The second encoder 420 encodes the output sequence from the interleaver 410 in the same way as in the first encoder 400.

FIG. 4B shows the trellis diagram for the encoder of FIG. 4A. In FIG. 4B, dashed lines indicate paths from each state of the previous time unit to each state of the current time unit when the input data is 1, and solid lines indicate paths from each state of the previous time unit to each state of the current time unit when the input data is 0.

Turning back to FIG. 3, the BMU 300 calculates branch metrics for received data. Branch metrics refer to the degree of similarity between a symbol $X_kY_{ik}$ to be received from an error-free transmission site, and an actual received symbol. The degree of similarity can be calculated by the Hamming distance or the Euclidean distance.

The ACSU 302 outputs a delta value and two selector bits for path selection, from the state metrics and branch metrics of the previous time unit for every state shown in FIG. 4B, and new state metrics for every state of the current time unit. The delta values, the elector bits and the new state metrics will be described in greater detail.

Figure 5:
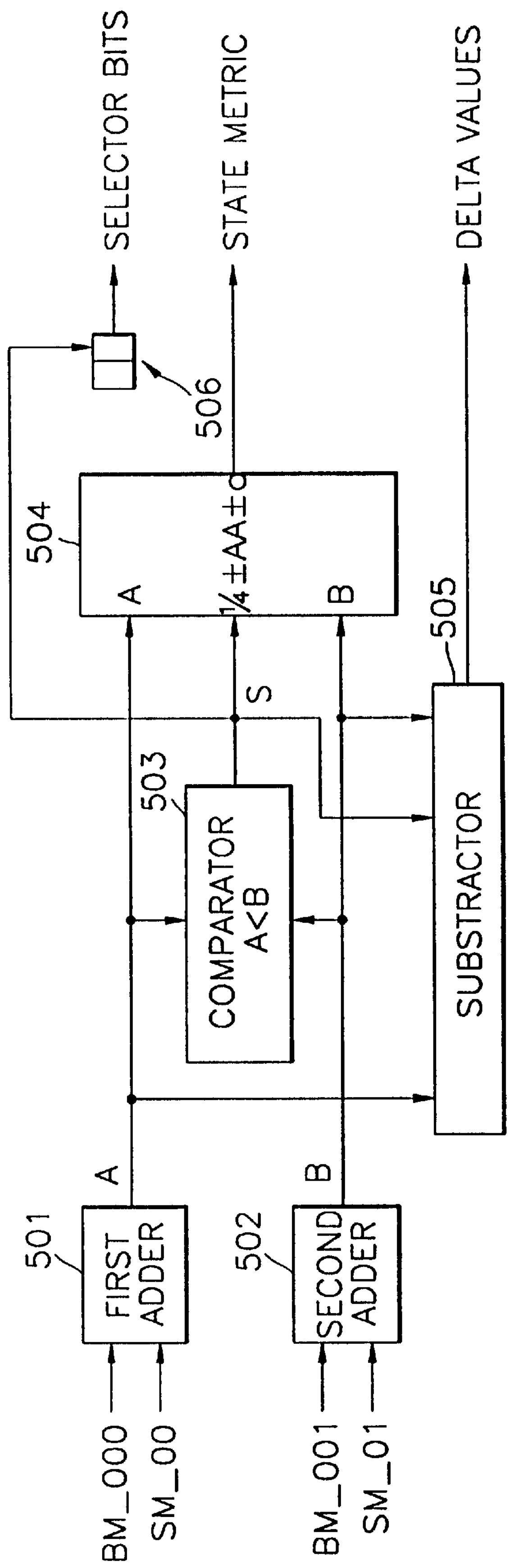
FIG. 5 is a detailed block diagram of the add-compare-select unit (ACSU) of FIG. 3.

FIG. 5 is a detailed block diagram of the ACSU 302. In FIG. 5, the ACSU 302 calculates the above-mentioned parameters for the state 00 of the current time unit of FIG. 4B, using branches which extend from the states 00 and 01 of the previous time unit to the state 00 of the current time unit, which is performed in the same way as for the other state of the current time unit.

The ACSU of FIG. 5 includes a first adder 501, a second adder 502, a comparator 503, a subtracter 505, a selector 504 and a selector bit memory 506. The first and second adders 501 and 502 sum the branch metrics and state metrics for the states 00 and 01 of the previous time unit, respectively, and output the results of summation A and B, respectively.

The comparator 503 compares A and B, and outputs an ON-signal if a predetermined condition is satisfied. For example, if all metrics are calculated by the Hamming distance, the ON-signal is output when A is less than B. On the other hand, if all metrics are calculated by the Euclidean distance, the ON-signal is output when A is greater than B.

The selector 504 outputs A or B as the state metric of the current time unit in response to the ON-signal. The subtracter 505 outputs a delta value by subtracting B from A. The two data bits stored in the selector bit memory 506 include the most significant bit (MSB) whose value is replaced by the value of the least significant bit (LSB) of the current time unit state, and the least significant bit (LSB) whose value is replaced by the LSB of the selector bits of the current time unit. However, the number of data bits stored in the selector bit memory 506 varies depending on the constraint length, and data to be stored therein is decided by path selection information determined by the coding scheme adopted by a transmission site.

If the states for the current time unit are 01 and 10, the LSB of the current time unit state is inverted by an invertor (not shown), which may be further included for this case, and the inverted LSB is stored as the MSB in the selector bit memory 506.

The state metrics from the ACSU 302 are stored in the SMM 304. The SMM 304 feeds the state metrics stored therein back to the ACSU 302 to enable the ACSU 302 to calculate the state metrics for the next time unit. The survivor state output unit 306 compares the state metrics for all states of the current time unit and outputs the state which has the maximum likelihood value, as the survivor state.

The SOVA-SMU 308 calculates by trace back operation a survivor state $m_L$ and a soft decision value $W_L$ of the survivor path for current time unit k, from the survivor state output from the survivor state output unit 306 using the selector bits and delta values for all states for the current time unit. If the hard decision values of the survivor path and the concurrent path for the previous time unit are different, and the soft decision value of the survivor path for the previous time unit is greater than the soft decision value of the survivor path for the current time unit, the soft decision value of the survivor path for the previous time unit is replaced by the soft decision value for the current time unit.

Figure 6:
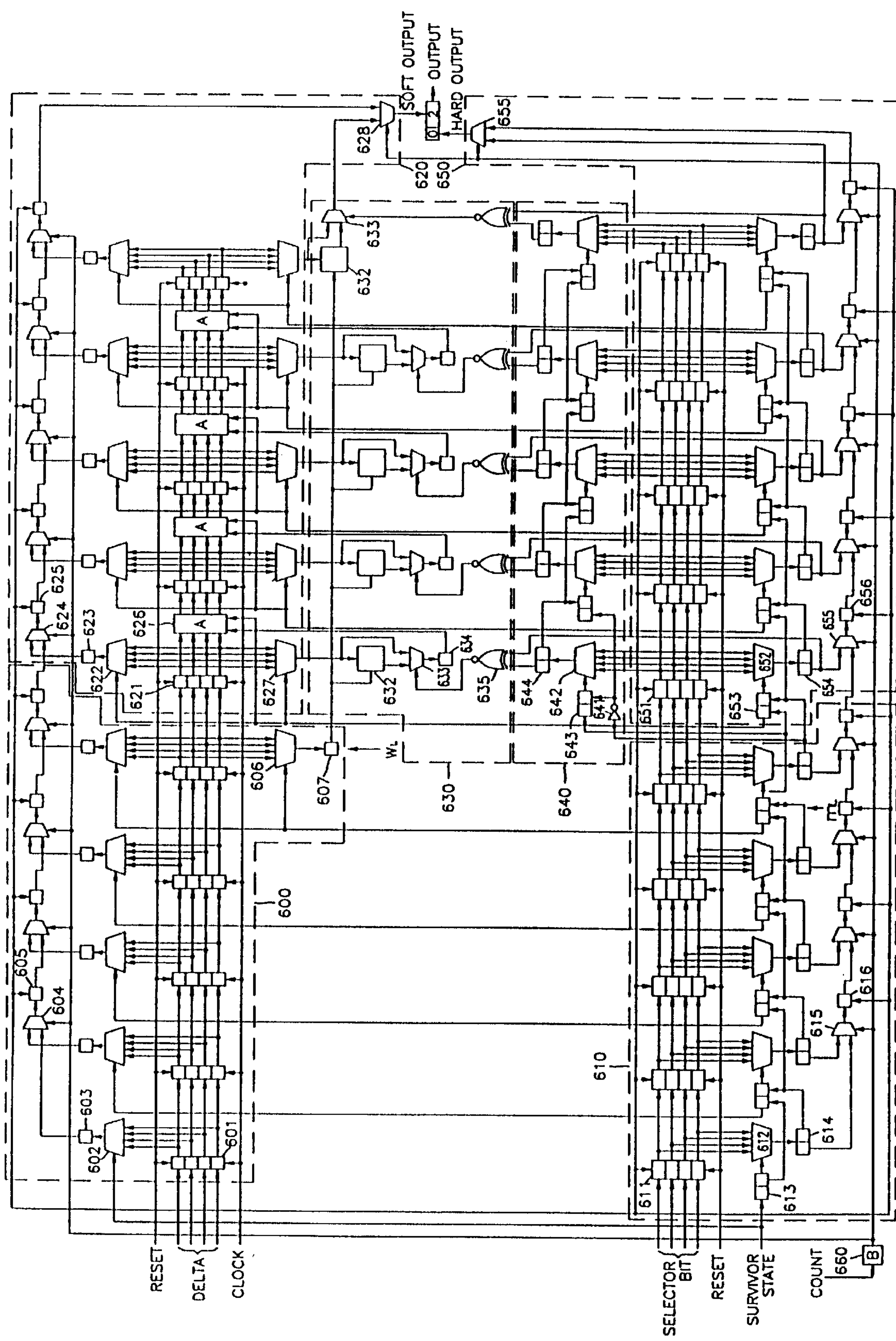
FIG. 6 is a circuit diagram of the soft output Viterbi algorithm-state metric unit (SOVA-SMU) of FIG. 3.
Figure 7:
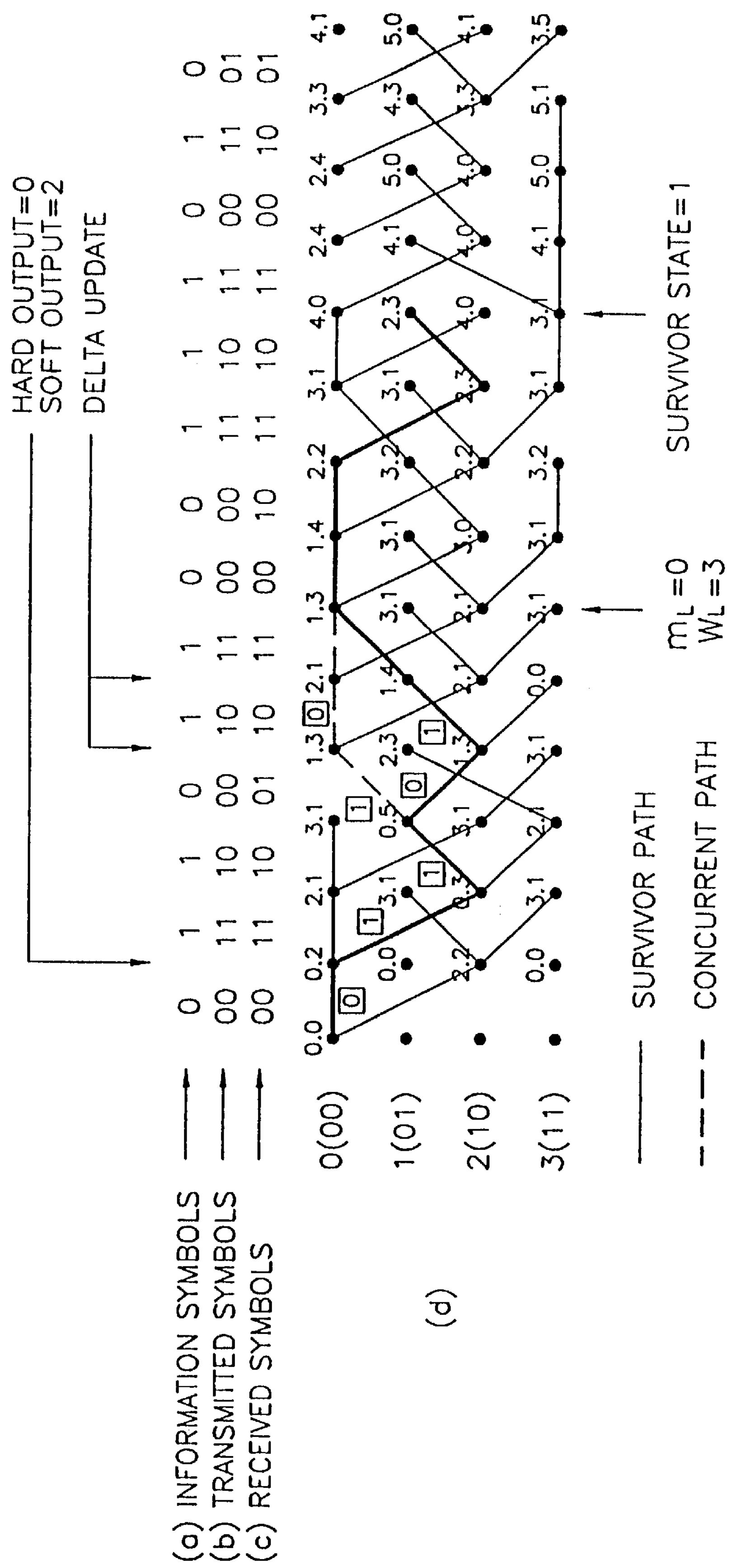
FIG. 7 is a trellis diagram illustrating the operation of the SOVA-SMU of FIG. 6.

FIG. 6 is a circuit diagram of the SOVA-SMU 308 of FIG. 3. The trace back system of FIG. 6 has a depth of 5+5, and the depth may be arbitrarily expanded. FIG. 7 is a trellis diagram illustrating the operation of the SOVA-SMU 308 of FIG. 6 with a trellis (d). In FIG. 7, (a) indicates information symbol sequence, (b) indicates transmitted symbol sequence, and (c) indicates received symbol sequence.

The SOVA-SMU of FIG. 6 includes a first-step soft decision output portion 600, a first-step hard decision output portion 610, a second-step soft decision output portion 620, a soft decision updating command portion 630, a concurrent path hard decision output portion 640, a survivor path hard decision output portion 650, and a counter 660 for counting the number of symbols for a single frame.

The first-step soft decision output portion 600 and the first-step hard decision output portion 610 determines a soft decision value $W_L$ of the survivor path and the survivor state $m_L$ for the current time unit, respectively. Here, the survivor state output from the survivor state output unit 306 is 1, as shown in FIG. 7.

The second-step soft decision output portion 620 outputs soft decision values for all survivor states during each time unit of the survivor path. If the hard decision values of the survivor path and the concurrent path for the previous time unit are different, and if the soft decision value of the survivor path for the previous time unit is greater than that of the survivor path for the current time unit, the soft decision updating command portion 630 has the soft decision value of the survivor path output from the second-step soft decision output portion 620 replaced by the soft decision value for the current time unit. The concurrent path hard decision output portion 640 and the survivor path hard decision output portion 650 find the concurrent path and survivor path, respectively, by performing a double trace back from the survivor state $m_L$, and output the hard decision values for the two paths, respectively.

The first-step soft decision output portion 600 determines the state metric $W_L$ by performing a trace back using the delta (Δ) values for all states during the current time unit output from the ACSU 302 of FIG. 3. The first hard decision output portion 610 determines the survivor state $m_L$ by performing a trace back using the selector bits output from the ACSU 302 and the survivor state, which are output from the survivor state output unit 306. In the present embodiment, $m_L$=0 and $W_L$=3, as shown in FIG. 7.

The first-step soft decision output portion 600 includes a plurality of first registers 601, a plurality of first multiplexers 602 and 606, a plurality of first buffers 603 and 607, a plurality of second multiplexers 604, and a plurality of second buffers 605.

The first registers 601 store the respective delta values for each state of the current time unit from the ACSU 302 of FIG. 3 and shift the delta values in response to a clock signal. Each of the first multiplexers 602 and 606 selects one of the delta values received from the corresponding first register 601 according to the survivor state for each time unit and outputs the selected delta value. The first buffers 603 and 607 temporarily store the outputs from the first multiplexers 602 and 606. Each of the second multiplexers 604 selects one of the outputs for the current time unit and the previous time unit from the corresponding first buffer 603 according to the output signal from the counter 660. The second buffers 605 temporarily store the outputs from the second multiplexers 604, and output the stored values in response to a clock signal.

The first-step hard decision output portion 610 includes a plurality of second registers 611, a plurality of third buffers 613, a plurality of third multiplexers 612, a plurality of fourth buffers 614, a plurality of fourth multiplexers 615 and a plurality of fifth buffers 616.

Each of the second registers 611 stores selector bits of 2-bit size for each state of the current time unit output from the ACSU 302, and shifts the selector bits in response to a clock signal. The third buffers 613 store the survivor states for each time unit. Each of the third multiplexers 612 selects one of the selector bits according to the survivor state stored in the corresponding third buffer 613. The fourth buffers 614 temporarily store the outputs from the third multiplexers 612. Each of the fourth multiplexers 615 selects one of the MSBs for the current time unit and for the previous time unit output from the corresponding fourth buffer 614 according to the output signal from the counter 660. The fifth buffers 616 temporarily store the outputs from the fourth multiplexers 615 and output the stored values in response to a clock signal. The survivor state data for the current time unit stored in the third buffers 613 corresponds to the survivor state for the current time unit output from the survivor state output unit 306. On the other hand, the survivor state data for the previous time unit stored in the third buffers 613 includes two bits whose MSB data is the LSB data of the survivor state for the current time unit, and whose LSB data is the LSB data for the current time unit of the fourth buffer 614.

The second-step soft decision output portion 620, the soft decision update portion 630, the concurrent path hard decision output portion 640 and the survivor path hard decision output portion 650 perform a double trace back from the survivor state $m_L$ determined at the end of the first hard decision output portion 610 using the state metrics from the first-step soft decision output portion 600.

The survivor path hard decision output portion 650 includes a plurality of third registers 651, a plurality of second buffers 653, a plurality of fifth multiplexers 652, a plurality of seventh buffers 654, a plurality of sixth multiplexers 655 and a plurality of eighth buffers 656.

The structure and operation of the survivor path hard decision output portion 650 are similar to those of the first hard decision output portion 610. The leading one of the third registers 651 stores the data from the last one of the second registers 611 of the first hard decision output portion 610, and sequentially shifts the data to the next third register 651 in response to the clock signal. The sixth buffers 653 store the survivor states for each time unit of the survivor path in the same way as in the third buffers 613 of the first-step hard decision output portion 610. Each of the fifth multiplexers 652 selects one of the outputs from the corresponding third register 651 in response to the output from the corresponding sixth buffer 653. The seventh buffers 654 temporarily store the outputs from the fifth multiplexers 652. Each of the sixth multiplexers 655 selects one of the MSBs for the current time unit and for the previous time unit of the corresponding seventh buffer 654 in response to the output signal from the counter 660. The eighth buffers 656 temporarily store the outputs from the sixth multiplexers 655, and output the stored values in response to the clock signal. The output from the last one of the sixth multiplexers 655 is the final decoded data.

The concurrent hard decision output portion 640 includes a plurality of ninth buffers 643, a plurality of seventh multiplexers 642 and a plurality of tenth buffers 644. The ninth buffers 643 store the sates for each time unit on the concurrent path. Each of the seventh multiplexers 642 selects one of the outputs from the corresponding third register 651 of the survivor path hard decision output portion 650 in response to the output from the corresponding ninth buffer 643. The tenth buffers 644 temporarily store the outputs from the seventh multiplexers 642. The concurrent states stored in the ninth buffers 643 are determined by the survivor state from the survivor path hard decision output portion 650 and the coding scheme of a transmission site, and are characterized for the present embodiment in that the LSB of the leading one of the ninth buffers 643 is inverted from the LSB for the previous time unit of the corresponding fourth buffer 614 of the first-step hard decision output portion 610. Reference numeral 641 represents an inverter used for the inversion.

If the hard decision values for each time unit output from the survivor path hard decision output portion 650 and the concurrent path hard decision output portion 640 are different, and if the soft decision value $W_L$ output from the first-step soft decision output portion 610 is larger than the soft decision value calculated by the second-step soft decision output portion 620, the soft decision updating command portion 630 outputs a signal to the second-step soft decision output portion 620 to enable it to replace the calculated soft decision value by the soft decision value $W_L$.

The soft decision updating command portion 630 includes a plurality of minimum value operating units 632, a plurality of exclusive OR operators 635, a plurality of eighth multiplexers 633 and a plurality of eleventh buffers 634.

Each of the minimum value operating units 632 selects the minimum value between the soft decision value $W_L$ output from the last one of the first buffers 607 of the first-state soft decision output portion 600, and the soft decision value for each time unit output from the second-state soft decision output portion 620. Each of the exclusive OR operators 635 receives a hard decision value from the survivor path hard decision output portion 650 and a hard decision value from the concurrent path hard decision output portion 640, and outputs an ON signal only when the two received hard decision values are different. Each of the eighth multiplexers 633 selects the output from the corresponding minimum value operating unit 632, or a soft decision value from the second soft decision output portion 620, in response to the ON-signal from the corresponding exclusive OR operator 635. The eleventh buffers 634 temporarily store the outputs from the eighth multiplexers 633.

The second-step soft decision output portion 620 includes a plurality of fourth registers 621, a plurality of ninth and tenth multiplexers 622 and 627, a plurality of twelfth buffers 623, a plurality of eleventh multiplexers 624, a plurality of thirteenth buffers 625, a twelfth multiplexer 628, and a plurality of soft decision update blocks 626.

Each of the fourth registers 621 stores the delta value from the corresponding first register 601 of the first-state soft decision output portion 600, and sequentially shifts the stored delta values to the next fourth register 621. Each of the ninth multiplexers 622 and each of the tenth multiplexers 627 select one of the output values from the corresponding fourth register 621 according to the survivor state output from the corresponding sixth buffer 653 of the survivor path hard decision output portion 650. The twelfth buffers 623 temporarily store the outputs from the ninth multiplexers 622. Each of the eleventh multiplexers 624 selects one of the outputs for the current time unit and for the previous time unit of the corresponding twelfth buffer 623. The thirteenth buffers 625 temporarily store the outputs from the eleventh multiplexers 624. The twelfth multiplexer 628 selects the output from the last one of the thirteenth buffers 625 or the output from the last one of the eighth multiplexers 633 of the soft decision update portion 630. Each of the soft decision update blocks 626 receives the delta values from the corresponding fourth register 621, and performs a predetermined operation, as illustrated in FIGS. 8A and 8B, according to select signals, one of which is the survivor state for each time unit output from the survivor path hard decision output portion 650, and the other of which is the output from the corresponding eleventh buffers 634 of the soft decision update portion 630, thereby updating the soft decision value from the first-state soft decision output portion 610.

Figures 8A, 8B:
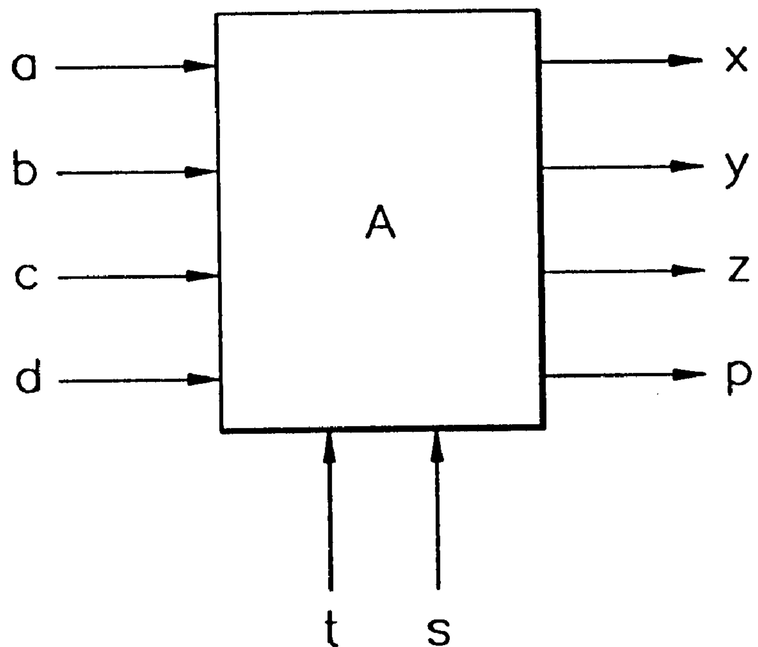
FIG. 8A illustrates the input and output ports of block A of FIG. 6.
FIG. 8B illustrates the operation of block A.

Referring to FIG. 8A, the select signals are designated with t and s, the input data of the soft decision update block 626 are designated with a, b, c and d, and the output data are designated with x, y, z and p. In this state, the soft decision update block 626 performs a predetermined operation as illustrated in FIG. 8B. In the present embodiment, t represents the output from one of the eleventh buffers 634 of the soft decision update directing portion 630, and s represents each state value for each time unit of the survivor path output from the survivor path hard decision output portion 650. The input data a, b, c and d are outputs from one of the fourth registers 621 during the next time unit.

Figure 9:
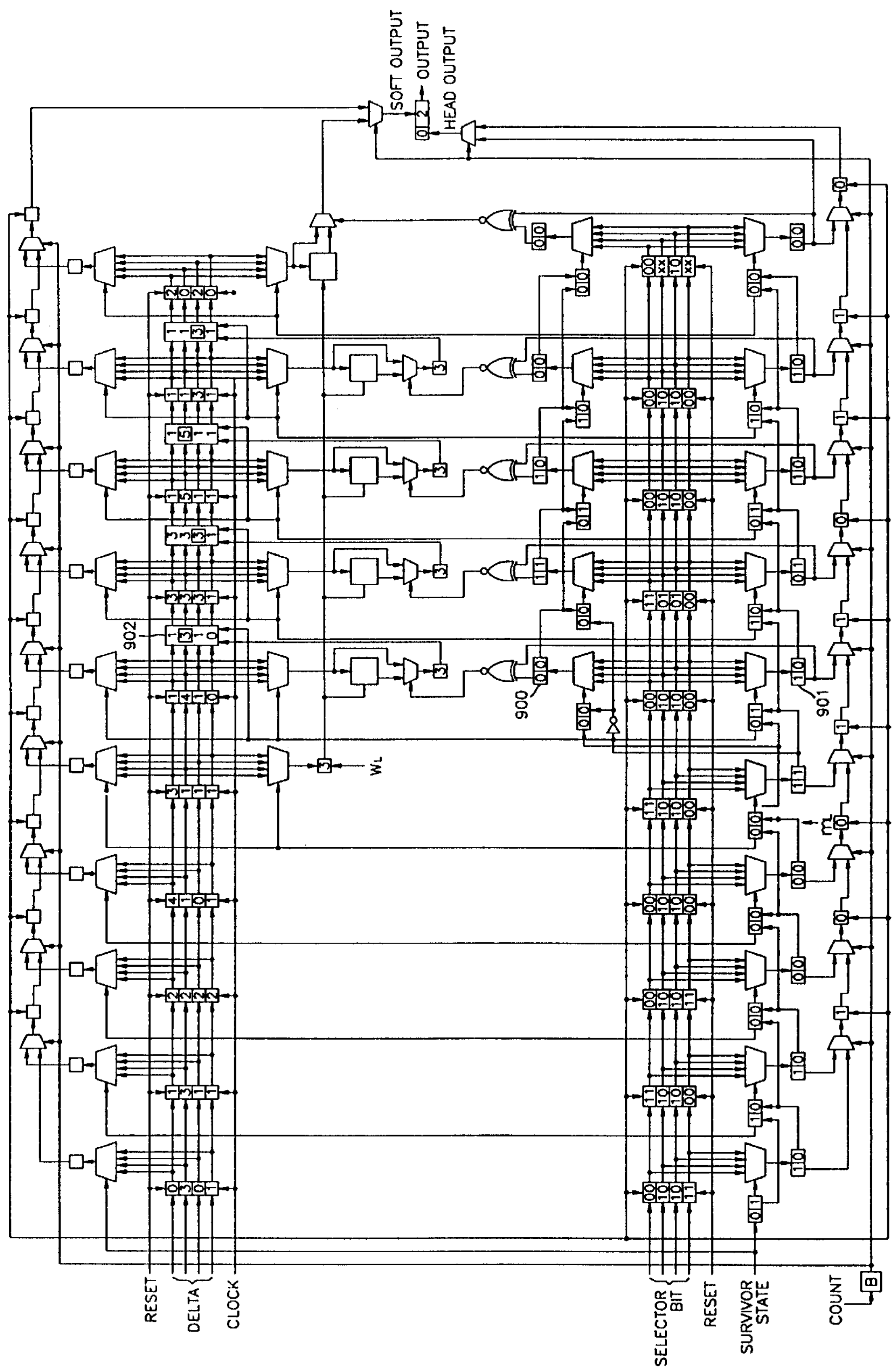
FIG. 9 illustrates the operation of the SOVA-SMU based on the data and the trace back illustrated in FIG. 7.

FIG. 9 shows the major output values from the SOVA-SMU of FIG. 6 when a trace back is performed with the data symbols and the trellis of FIG. 7. Reference numeral 900 indicates the hard decision outputs from the concurrent path hard decision output portion 620 of FIG. 6, reference numeral 901 indicates the hard decision outputs from the survivor path hard decision output portion 650, and reference numeral 902 indicates updated soft decision values of the second-state soft decision output portion 620.

As previously described, the two-step SOVA decoder according to the present invention stores delta values and information on the survivor state using a shift register chain, rather than using a memory, which enables a two-step SOVA algorithm within a single clock. As a result, soft decision values and hard decision values can be calculated within a short period of time, compared to the case of using a memory.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A two-step soft output Viterbi algorithm decoder, comprising:

a branch metric unit for calculating branch metrics for received data from the degree of similarity between data symbols, which appear to be received if a transmission channel has no error, and the actually received data symbols;

a state metric memory for storing state metrics for all states of the received data symbols;

an add-compare-select unit for adding the branch metrics of the branches for each state of the current time unit and the state metrics for each state of the previous time unit stored in the state metric memory, storing the results of the additions, which satisfies a predetermined condition, as the state metrics of the current time unit in the state metric memory, and outputting a difference between the results of the additions as a delta value, and as many selector bits as the number of bits of the received data symbols so as to select a path;

a survivor state output unit for outputting a survivor state satisfying a predetermined condition among the current state metrics for all states output from the add-compare-select unit; and a soft output Viterbi algorithm-state metric unit (SOVA-SMU) for back tracing a first survivor path for a first time unit from the survivor state output from the survivor state output unit, using the delta values for all states and the selector bits, to obtain the survivor state at the end of the first survivor path and a soft decision value of the first survivor path, for performing a double trace back for a second time unit from the survivor state at the end of the first survivor path to find a second survivor path and a concurrent path, for updating a soft decision value of the second survivor path by the soft decision value of the first survivor path if the hard decision values of the second survivor path and the concurrent path for the second time unit are different and if a soft decision value of the second survivor path is larger than the soft decision value of the first survivor path, and for outputting the hard and soft decision values of the second survivor path at the end of the second time unit.

2. The two-step soft output Viterbi algorithm decoder of claim 1, wherein the add-compare-select unit comprises:

a plurality of adders for adding the branch metric for each state of the current time unit and the state metric for each state of the previous time unit;

a comparative selector for comparing the output values from the adders, and outputting the smallest output value from the adders as the state metric of the current time unit; and a plurality of select bit memories corresponding to the number of states, for storing select bits for path selection from the state having the smallest output value from the adders, wherein each data bit is decided by path selection information determined by the coding scheme at a transmission site and the number of select bits are equal to the number of bits of the received data symbol.

3. The two-step soft output Viterbi algorithm decoder of claim 2, wherein the SOVA-SMU comprises:

a first-step hard decision output portion for finding the first survivor path from the survivor state for the first time unit using the selector bits, and outputting hard decision values for all states of the first survivor path;

a first-step soft decision output portion for outputting soft decision values of the first survivor path for all states for the first time unit using the delta values;

a survivor path hard decision output portion for finding the second survivor path for the second time unit from the survivor state output from the end of the first-step hard decision output portion, using the selector bits output from the end of the first-step hard decision output portion, and outputting the hard decision values for all states of the second survivor path;

a concurrent path hard decision output portion for finding a concurrent path for the second time unit from the survivor state output from at the end of the first-step hard decision output portion, and outputting the hard decision values for all states of the concurrent path;

a soft decision updating command portion for generating an update signal and outputting an update value if a hard decision value output from the survivor path hard decision output portion, and a hard decision value output from the concurrent path hard decision output portion are different; and a second-step soft decision output portion for outputting new soft decision values for the second time unit starting from the survivor state at the end of the first-step hard decision output portion, using the delta values for all states, wherein the soft decision value for each state of the first survivor path is replaced by the corresponding new soft decision value in response to the update signal.

4. The two-step soft output Viterbi algorithm decoder of claim 3, wherein the first-step hard decision output portion comprises:

a plurality of first registers each for storing the selector bits and shifting the stored selector bits to the previous time unit in response to a clock signal;

a plurality of first multiplexers each for selecting and outputting one of the outputs from the corresponding first register for each time unit in response to a predetermined select signal;

a plurality of first buffers each for storing the survivor state of the first previous path, and outputting the stored survivor state as the select signal to the corresponding first multiplexer, wherein the survivor state for the previous time unit is determined by the output from the corresponding first multiplexer and the survivor state for the current time unit;

a plurality of second multiplexers each for outputting one of the hard decision values for the current time unit and for the previous time unit stored in the corresponding first buffer, as a hard decision value; and a plurality of second buffers each for temporarily storing the output from the corresponding second multiplexer, and outputting the stored data to the preceding one of the second multiplexers in response to the clock signal.

5. The two-step soft output Viterbi algorithm decoder of claim 4, wherein the first-step soft decision output portion comprises:

a plurality of second registers each for storing the delta values and shifting the stored data in response to a clock signal;

a plurality of third multiplexers each for selecting and outputting one of the outputs from the corresponding second register at each time unit according to the selection state output from the corresponding first buffer;

a plurality of fourth multiplexers each for selecting and outputting one of the outputs for the current time unit and for the previous time unit from the corresponding third multiplexer; and a plurality of third buffers each for temporarily storing the output from the corresponding fourth multiplexer and outputting the stored value to the preceding one of the third multiplexers in response to the clock signal.

6. The two-step soft output Viterbi algorithm decoder of claim 5, wherein the survivor path hard decision output portion comprises:

a plurality of third registers each for storing the select bits from the corresponding first register in response to the clock signal, and shifting the stored data to the previous time unit in response to the clock signal;

a plurality of fifth multiplexers each for selecting and outputting one of the outputs from the corresponding third register for each time unit in response to a second select signal;

a plurality of fourth buffers each for storing the survivor state of the second survivor path, outputting the stored survivor state as the second select signal to the corresponding fifth multiplexer, wherein the survivor state for the previous time unit is determined by the output from the corresponding fifth multiplexer and the survivor state for the current time unit;

a plurality of sixth multiplexers each for outputting one of the hard decision values for the current time unit and for the previous time unit stored in the corresponding fourth buffer, as a hard decision value; and a plurality of fifth buffers each for temporarily storing the output from the corresponding sixth multiplexer, and outputting the stored data to the preceding one of the sixth multiplexers in response to the clock signal.

7. The two-step soft output Viterbi algorithm decoder of claim 6, wherein the concurrent path hard decision output portion comprises:

a plurality of seventh multiplexers each for selecting and outputting one of the outputs from the corresponding third register in response to a third select signal; and a plurality of sixth buffers each for storing the concurrent state of the concurrent path, and outputting the stored concurrent state as the third select signal to the corresponding seventh multiplexer, wherein the survivor state for the previous time unit is determined by the output from the corresponding seventh multiplexer and the concurrent state for the current time state.

8. The two-step soft output Viterbi algorithm decoder of claim 7, wherein the soft decision updating command portion comprises:

a plurality of OR operators each for performing an OR operation on a hard decision value from the survivor path hard decision output portion and the hard decision value output from the corresponding seventh multiplexer;

a plurality of minimum value operating units each for outputting the minimum value between the soft decision value output from the last one of the third multiplexers of the first-step soft decision output portion, and the soft decision value for each time unit output from the second-step soft decision output portion; and a plurality of eighth multiplexers each for selecting one of the output from the corresponding minimum value operating unit and the soft decision value for each time unit from the second-state soft decision output portion, according to the output from the corresponding OR operator.

9. The two-step soft output Viterbi algorithm decoder of claim 8, wherein the second-state soft decision output portion comprises:

a plurality of fourth registers each for storing the data from the last one of the first registers of the first-state soft decision output unit, and shifting the stored data to the preceding fourth register in response to the clock signal;

a plurality of ninth multiplexers each for selecting and outputting one of the outputs from the corresponding fourth register according to the output value from the corresponding fourth buffer of the survivor path hard decision output portion;

a plurality of tenth multiplexers each for selecting and outputting one of the outputs for the current time unit and for the previous time unit from the corresponding ninth multiplexer;

a plurality of seventh buffers each for temporarily storing the output from the corresponding tenth multiplexer, and outputting the stored value to the preceding tenth multiplexer in response to the clock signal; and a plurality of soft decision value updating portions each for updating the output from the corresponding fourth register by the output value from the corresponding eighth multiplexer according to the output value from the corresponding fourth buffer of the survivor path hard decision output portion.

10. The two-step soft output Viterbi algorithm decoder of claim 9, wherein when the input port of each of the soft decision value updating portions is connected to the output port of the corresponding fourth register, the first select port thereof is connected to the output port of the corresponding fourth buffer, and the second select port thereof is connected to the output port of the corresponding eighth multiplexer, the output value from each of the output ports is input to the corresponding input port, wherein the output ports selected by the first selector ports output data to be input to the second selector ports.

* * * * *